United States Patent [19]

Kadakia et al.

[11] Patent Number: 5,078,498
[45] Date of Patent: Jan. 7, 1992

[54] TWO-TRANSISTOR PROGRAMMABLE MEMORY CELL WITH A VERTICAL FLOATING GATE TRANSISTOR

[75] Inventors: Shailesh R. Kadakia, Sugarland; Kiyoshi Mori, Stafford, both of Tex.

[73] Assignee: Texas Instruments Incorporated, Dallas, Tex.

[21] Appl. No.: 546,065

[22] Filed: Jun. 29, 1990

[51] Int. Cl.$^5$ .................... H01L 29/10; H01L 29/78
[52] U.S. Cl. .................. 357/23.4; 357/23.5; 357/23.6
[58] Field of Search ............ 357/23.6 G, 23.4, 23.5, 357/23.6 G; 365/185

[56] References Cited

U.S. PATENT DOCUMENTS

| | | | |
|---|---|---|---|
| 4,774,556 | 9/1988 | Fujii et al. | 357/23.4 |
| 4,835,741 | 5/1989 | Baglee | 365/185 |
| 4,929,988 | 5/1990 | Yoshikawa | 357/23.5 |
| 4,964,080 | 10/1990 | Tzeng | 357/23.5 |

FOREIGN PATENT DOCUMENTS

| | | | |
|---|---|---|---|
| 60-236260 | 11/1985 | Japan | 357/23.6 G |
| 62-256673 | 11/1986 | Japan | 357/23.5 |
| 62-54954 | 3/1987 | Japan | 357/23.6 G |
| 62-72171 | 4/1987 | Japan | 357/23.5 |
| 62-86866 | 4/1987 | Japan | 357/23.5 |

Primary Examiner—Andrew J. James
Assistant Examiner—Sara W. Crane
Attorney, Agent, or Firm—Ronald O. Neerings; Lawrence J. Bassuk; Richard L. Donaldson

[57] ABSTRACT

A two-transistor programmable memory cell (FIG. 1A, 20) with one vertical floating gate transistor (VT) and one planar transistor (PT)—the planar transistor can be optimized for programming with low current (longer channel length and narrower channel width), while the vertical transistor can be optimized for reading with high current (shorter channel length and wider channel width). The vertical transistor is formed in a trench (22) with a source region (15) and a sub-source VT drain region (23). The planar transistor includes the source region (15) and a co-planar PT drain region (27).

15 Claims, 3 Drawing Sheets

TWO-TRANSISTOR PROGRAMMABLE MEMORY CELL WITH A VERTICAL FLOATING GATE TRANSISTOR

TECHNICAL FIELD OF THE INVENTION

The invention relates generally to memory devices, and more particularly relates to a two-transistor cell with a vertical floating gate transistor, for use in such devices as EPROMs and logic arrays, and a method of fabrication.

RELATED PATENT

This patent incorporates by reference the subject matter of co-pending U.S. Pat. application Ser. No. 07/449,135, now U.S. Pat. No. 5,016,068, issued May 14, 1991, entitled "Vertical Floating-Gate Transistor", filed Dec. 8, 1989, which is a continuation of U.S. Pat. application No. 07/181,789, filed Apr. 15, 1988, now abandoned, which is assigned to Texas Instruments Inc., the assignee of this application.

BACKGROUND OF THE INVENTION

Such logic devices as memories and logic arrays often use programmable read only memory cells for the non-volatile storage of information. Common examples of memory devices are erasable and programmable read only memories (EPROMs), and electrically erasable and programmable memories (EEPROMs).

The design of the memory cell transistors for these devices involves a trade-off between optimizing either the program current (which is preferable low), or the read (sense) current (which is preferably high). While two transistors could be used for each cell, respectively optimized for programming and reading, such an approach conflicts with another design constraint-reduced cell size for greater density.

The problem to which the invention is directed is the design of an electrically programmable memory cell that allows optimization of program and read current while using significantly less chip area than current two-transistor cell structures. Such a memory cell could be used in EPROMs, EEPROMs, logic arrays and other logic devices.

Programmable read only memory cells commonly use FET transistors with a floating gate structure. The logic state of the cell depends upon the program charge stored on an electrically isolated floating gate, which controls the threshold voltage $V_T$ for conductance in the FET channel. The floating gate is programmed or erased using a program (or control) gate capacitively coupled to the floating gate.

A programming operation charges the floating gate by injecting hot carriers, resulting from channel hot electrons and/or avalanche breakdown, from the channel to the floating gate across the insulating gate (channel) oxide. A read operation determines logic state by differentiating between the impedance presented by a charged (high $V_T$) gate and an uncharged (low $V_T$) gate.

For this floating gate structure, a low program current is advantageous because of reduced programming current requirements, while a high read current improves read efficiency (clearly differentiating the high $V_T$ state from the low $V_T$ state). Current characteristics are an inverse function of channel length and a direct function of channel width.

For planar FET structures, channel length is determined by the width of the lines of photoresistive material used as an implant mask for implanting source and drain regions on either side of a photoresist line. Because cell size is a direct function of channel length, optimizing a transistor for read operations (high current characteristics), by reducing channel length, also minimizes cell area.

The vertical floating gate structure described in the related patent offers a fabrication technology that allows channel lengths to be reduced below 0.5 microns, and also significantly reduces cell size from that obtainable with current planar fabrication technology. As described in the related patent, the vertical floating gate structure is fabricated into a trench surrounded by buried, vertically-stacked source and drain regions separated by a buried channel region with a predetermined channel length (in the vertical dimension).

Accordingly, a need exists for an electrically programmable memory cell with two transistors respectively optimized for low programming current and high read current. Such a cell would have utility in a variety of logic devices, including EPROMs, EEPROMs and logic arrays.

SUMMARY OF THE INVENTION

The invention is a two-transistor programmable memory cell with one vertical floating gate transistor and one planar transistor—the planar transistor can be optimized for programming with low current (longer channel length and narrower channel width), while the vertical transistor can be optimized for reading with high current (shorter channel length and wider channel width).

In one aspect of the invention, the two-transistor programmable memory cell is formed in a substrate of a first conductivity type (such as P), and includes a vertical transistor (VT) and a planar transistor (PT). The vertical transistor is formed by a source region and a sub-source VT drain region, both of a second conductivity type (such as N+), vertically disposed in the substrate adjacent a trench, thereby defining a VT channel region with a selected VT channel length in the vertical dimension. The planar transistor includes the source region and a co-planar PT drain region, thereby defining a PT channel region with a selected PT channel length in the planar dimension.

A vertically-extending VT floating gate conductor is insulatively disposed in the trench, over the VT channel region, while a PT floating gate conductor is insulatively disposed over the PT channel region.

A VT program gate conductor is insulatively disposed over the VT floating gate, while a PT program gate conductor is insulatively disposed over the PT floating gate.

In more specific aspects of the invention, the VT channel length can be selected such that the vertical transistor is characterized by a relatively higher current capacity, and the PT channel length can be selected such that the planar transistor is characterized by a relatively lower current capacity.

The VT floating gate and the PT floating gate can be formed as segments of a single, continuous floating gate conductor. Similarly, the VT program gate and the PT program gate can be formed as segments of a single, continuous program gate conductor.

The VT floating gate can be disposed around the walls of the trench, defining a central hole. The VT program gate can then be disposed into this hole to maximize the capacitive coupling.

The technical advantages of the invention include the following. The two-transistor programmable memory cell can be optimized for both programming (requiring low current) and reading (providing high current). By using a vertical floating gate structure for the transistor used for reading, the channel length can be made shorter than practicable using current planar fabrication technology. Moreover, because the drain and source regions are formed in separate implant procedures, implant tailoring can be employed to optimize performance. In addition, by using a vertical floating gate structure for the read transistor, cell area for the two-transistors can be significantly reduced over that for two planar transistors. Both the floating gate and the program gate for the cell extend across the entire cell (both transistors) providing maximum overlap and increased capacitive coupling.

BRIEF DESCRIPTION OF THE DRAWINGS

For a more complete understanding of the invention, and for further features and advantages, reference is now made to the following Detailed Description of an exemplary embodiment of the invention, taken in conjunction with the accompanying Drawings, in which.

DETAILED DESCRIPTION OF THE INVENTION

The Detailed Description of exemplary embodiment of the two-transistor programmable memory cell, using one vertical floating gate transistor, of the invention is organized as follows:

1. Two-Transistor Memory Cell Array 1.1. Two-Transistor Structure 1.2. Array Structure 1.3. Operation 2. Method of Fabrication 2.1. Bitline Formation 2.2. Trench Formation 2.3. Gate Conductor Formation 3. Conclusion The exemplary embodiment is described in relation to a array structure, which could be used in a number of logic devices, such as EPROMs, EEPROMs or logic arrays, and uses the vertical floating gate structure described in the related application, the subject matter of which is incorporated by reference.

The Detailed Description of the two-transistor programmable memory cell is in terms of P-channel FET devices, although the teachings of the invention apply equally to N-channel devices. The use of the source-drain terminology in connect with specific doped regions of a substrate is exemplary, and any such designations could be reversed. The FIGURES are illustrative, and are neither, drawn to scale nor precisely lined.

Figure 1:
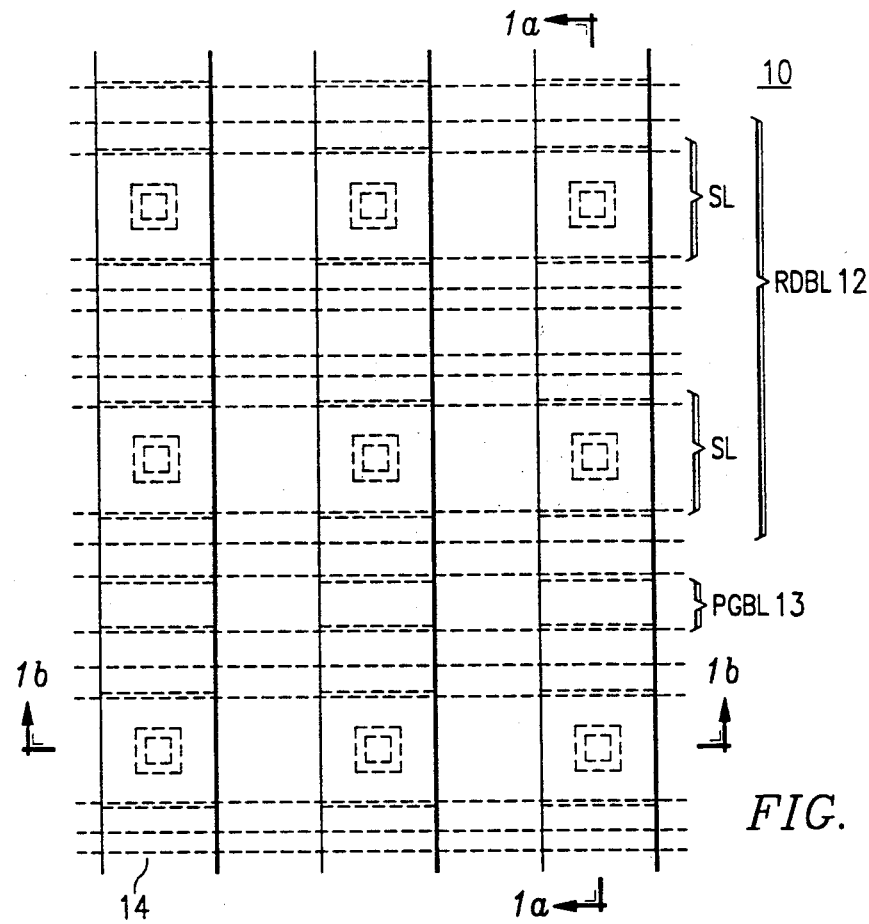
FIG. 1 is a plan view of the surface of a portion of an array of two-transistor programmable memory cells with one vertical floating gate transistor according to the invention.
Figure 1A:
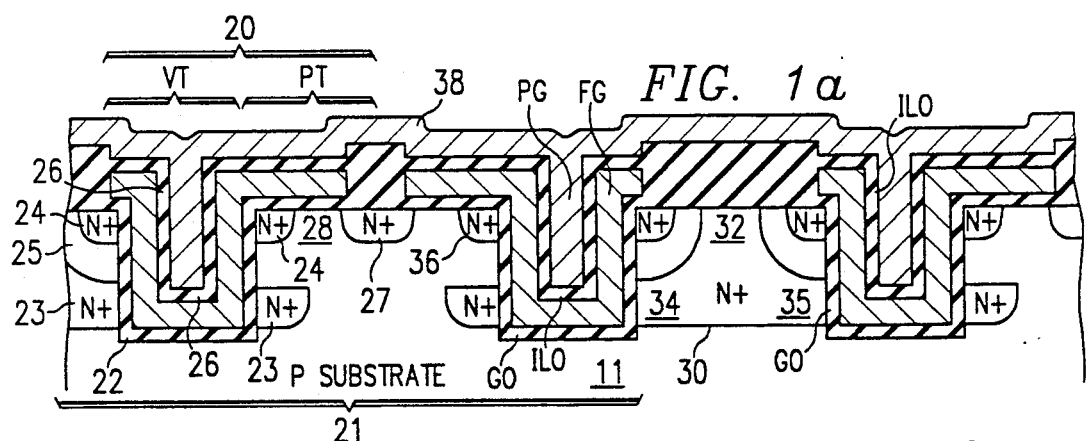
FIGS. 1a and 1b are elevation cross section views respectively of a bitline row and a wordline column of the array in FIG. 1.
Figure 1B:
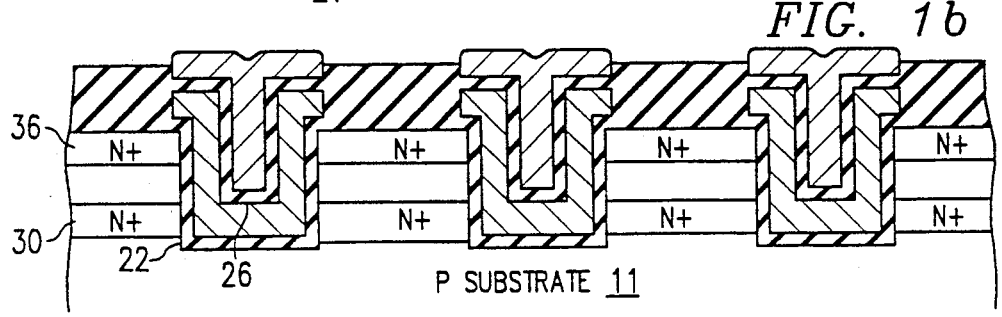

1. Two-Transistor Memory Cell Array. FIGS. 1, 1a and 1b illustrate the structure of an exemplary two-transistor programmable memory cell with one vertical transistor and one planar transistor according to the invention, configured in an array.

FIG. 1 is a plan view illustrating a portion 10 of an array of two-transistor programmable memory cells, fabricated on a substrate 11. The array comprises a grid with rows formed by read/program buried bitlines 12/13, and columns formed by wordlines 14.

As described in Section 1.2, for each two-transistor memory cell, read bitlines 12 form the sub-surface drain region for the vertical transistor VT, while program bitlines 13 form the drain region for the planar transistor. In addition, a buried sourceline 15 forms the shared source region for both transistors.

In the exemplary array configuration, memory cells 20 are fabricated in mirror-image pairs, with each cell pair 21 including two read bitlines 12 on either side of a shared program bitline 13, together with two sourcelines 15.

1.1. Two-Transistor Structure. FIGS. 1a and 1b are cross sectional views, respectively of a wordline column and bitline row, that illustrate the basic structure of a two-transistor programmable memory cell as used in the exemplary embodiment of the invention.

Each two-transistor programmable memory cell 20 includes a vertical floating gate transistor VT and a planar transistor PT (not shown in FIG. 1b).

Referring to FIGS. 1a and 1b, the vertical floating gate transistor VT is fabricated in a trench 22 that, for the exemplary embodiment, is substantially square with substantially vertical sidewalls.

Disposed around the lower portion of the trench is a buried N+VT drain region 23, and disposed around the upper portion of the trench (at the surface of substrate 11) is a buried N+ source region 24 (which is shared with the planar transistor PT). A vertically-extending VT channel region 25 is defined between the source and drain regions, with the configuration of the source and drain regions relative to the trench depth determining the channel length in the vertical dimension.

Referring to FIG. 1a, the planar transistor PT is fabricated at the surface of the substrate 11. The buried N+ source region 24 for the vertical transistor VT is also the source region for the planar transistor PT. A co-planar buried N+PT drain region 27 is formed in the substrate, defining a PT channel region 28. The configuration of the source and drain regions determines the channel length in the planar dimension.

Referring to FIGS. 1a and 1b, an electrically isolated floating gate FG includes a vertically-extending VT segment for the vertical transistor VT and a planar PT segment for the planar transistor PT. The VT segment of the floating gate is disposed around the walls of trench 22, defining a central hole 26, extending across VT channel region 25. The PT segment of the floating gate extends across PT channel region 28.

A program gate conductor PG includes a vertically-extending VT segment for the vertical transistor VT and a planar PT segment for the planar transistor PT. The VT program gate segment extends into hole 26, overlapping the VT segment of the floating gate. The PT program gate segment extends across the PT transistor, overlapping the PT segment of the floating gate. Thus, overlap between the program gate and the floating gate is maximized, thereby maximizing the capacitive coupling coefficient and minimizing the program gate voltage required to charge the floating gate (for a given channel length).

The floating gate FG is insulated from the VT and PT channel regions by a gate (channel) oxide layer GO of a selected gate oxide thickness, and from the program gate conductor PG by an interlevel oxide layer ILO.

1.2. Array structure. For the exemplary embodiment, the two-transistor programmable memory cell of the invention is incorporated into an array, such as an EEPROM or logic array.

Referring to FIGS. 1a and 1b, for the exemplary array, each column of memory cells includes a series of two-transistor memory cell pairs 21, with the vertical transistors VT on either end and the planar transistors PT in the middle.

For each row of cell pairs 21, two buried read bitlines 30 extend respectively along either end adjacent the vertical transistors, while a single buried program bitline 38 extends through the center between the planar transistors. Each cell pair includes two sourcelines 36, extending through the area occupied by the vertical transistors (i.e., around the VT trenches).

Referring to FIG. 1a, each buried read bitline 30 is shared by the adjacent vertical transistors VT of adjacent cell pairs. A read bitline 30 includes a narrow surface section 32 between the vertical transistors, transitioning into two sub-surface drain sections 34 and 35 that extend in opposite directions through the areas occupied by the respective vertical transistors, and under respective sourcelines.

Each VT trench 22 extends through a corresponding sourceline 36, forming source regions 24, and through the drain sections 34/35 of the read bitlines, forming the VT drain region- 23.

Referring to FIG. 1a, each column of cell pairs includes a wordline 38 (14 in FIG. 1) that incorporates the program gates PG for each of the memory cells. Thus, at each cell 20, the wordline incorporates the VT program gate segment that extends vertically into the trench hole 26 overlapping the VT floating gate segment, and a PT program gate segment that extends over the planar transistor overlapping the PT floating gate segment.

At one end of each program, read and sourceline, and each wordline, an electrical contact area (not shown) is provided in a conventional manner for contactless arrays.

Figure 2:
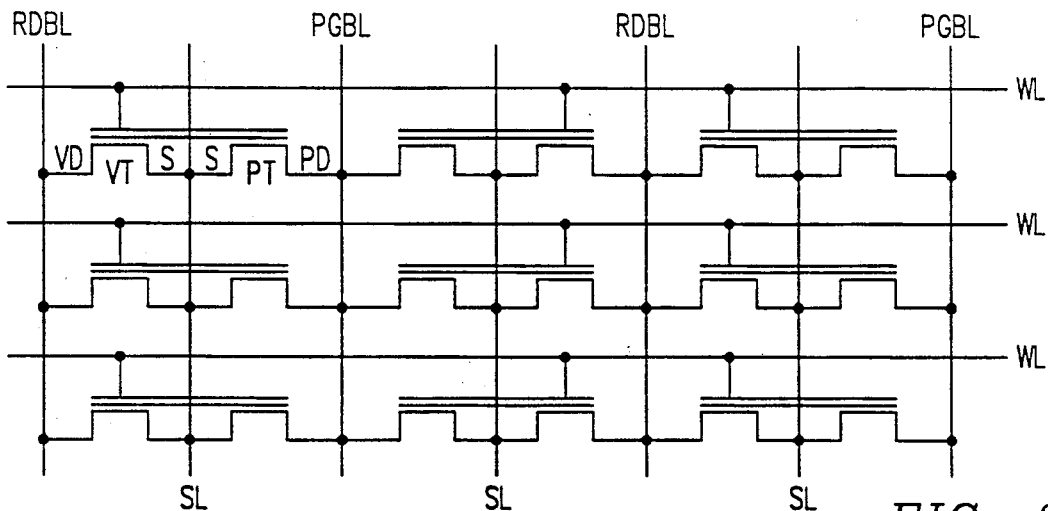
FIG. 2 illustrates the circuit configuration for the array.

1.3. Operation. FIG. 2 provides a circuit representation of the two-transistor programmable memory cell array of the invention.

Each two-transistor memory cell 20 of a cell pair 21 (corresponding to cell 20 and cell pair 21 in FIG. 1a), includes a vertical transistor VT and a planar transistor PT. The vertical transistor has a drain VD coupled to a read bitline RDBL, while the planar transistor has a drain PD coupled to a program bitline PGBL. The shared source S for the two transistors is coupled to a sourceline.

A wordline WL is coupled to the program gate PG. A floating gate FG is capacitively coupled between the program gate and the channels for the vertical and planar transistors.

Programming (write/erase) and reading operations are accomplished conventionally by the application of appropriate voltages on selected and deselected wordlines and on selected and deselected read/program bitlines RDBL/PGBL and the sourceline. For example, using N+ source/drain regions and P-type channels, if 0.5 microns and vertical channel width is about 2–3 microns, and the planar (program) transistor channel length is about 0.8 microns and the planar channel width is about 1–1.5 microns, then, with a sourceline voltage (virtual ground or VG) of about 0.5–1 volts, programming operations could be accomplished with about 7 volts on a selected wordline and about 5 volts on a selected program bitline PGBL, and read operations could be accomplished with about 5 volts on a selected wordline and about 1–1.5 volts on a selected read bitline RDBL.

2. Method of Fabrication. The method of fabricating an array of the exemplary two-transistor programmable memory cells according to the invention will be described in connection with fabricating an array in a substrate of P-type semiconductor to provide N-channel transistors. Conventional photolithographic techniques well known in the art are used—this description focuses on the major fabrication steps.

FIGS. 3a to 3g show the array at intermediate stages of fabrication. The starting material is a slice of P-type silicon of which only a portion is shown as substrate 11. A number of process steps would normally be performed to create transistors peripheral to the array, and these will not be described. For example, an exemplary EEPROM memory device may be of the complementary field effect type (CMOS) having N-wells and P-wells formed in the substrate as part of a prior process to create peripheral transistors.

2.1. Bitline Formation. Referring to FIGURES 3a–3d, the first stage of fabrication involves forming rows of read and program bitlines and N+ sourcelines. The steps for each row are identical, and the description of this stage will focus on a single exemplary row. The array configuration is contactless, with electrical contacts being made to selected ends of the read, program and sourcelines—the formation of these contacts is conventional, and will not be described.

First, an N+ implant/diffusion using phosphorous forms a first, deep N+ region 42 that will form the read (drain) bitline (30 in FIG. 1a). Substrate 11 is patterned to expose a strip of substrate surface with a selected width corresponding to the width of the sub-surface drain sections (34 and 35 in FIG. 1a).

The phosphorous implant is performed, to create the first N+ region 42 (phosphorous is preferred over, for example arsenic because of faster diffusion). Implant is followed by a thermal diffusion/annealing procedure, to provide thermal drive to a desired depth, and surface annealing. Final junction depth will depend upon subsequent thermal drive procedures, and corresponds to the desired maximum depth of the read bitline.

Figure 3A:
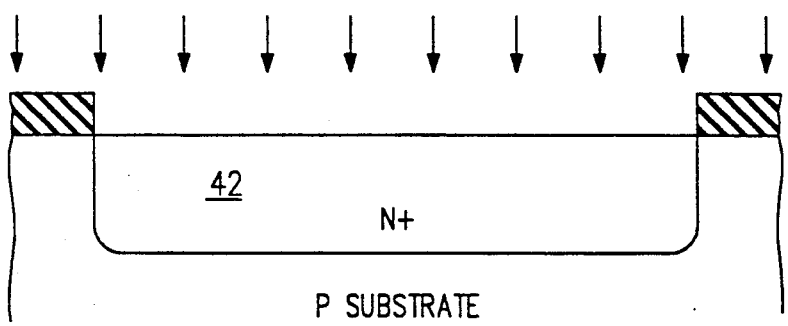
FIGS. 3a to 3g are elevation cross section views of the array at various intermediate stages of fabrication.
Figure 3B:
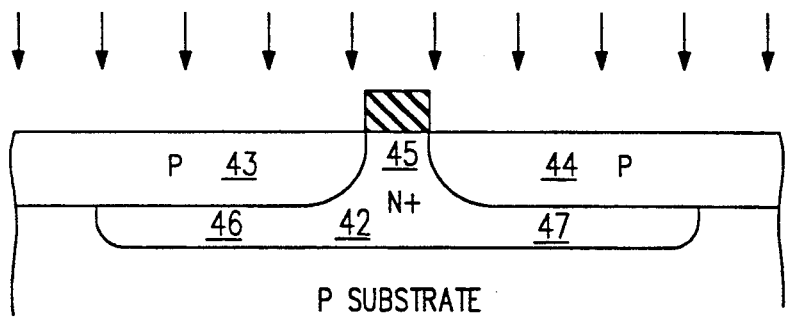

Referring to FIG. 3b, a P-type channel implant/diffusion using boron forms P-type substrate regions 43 and 44 into the upper portion of the N+ region 42. This channel implant configures the N+ bitline to include a central surface region 45 (32 in FIG. 1a), and horizontally extending sub-surface drain sections 46 and 47 (34 and 35 in FIG. 1a).

The boron implant is performed to create the N-channel regions. Implant is followed by a thermal diffusion/annealing procedure, to provide thermal drive to a desired depth, and surface annealing. Again, final junction depth will depend upon subsequent thermal drive procedures, and corresponds to the desired upper boundary of the drain/channel junctions for the vertical transistors.

Figure 3C:
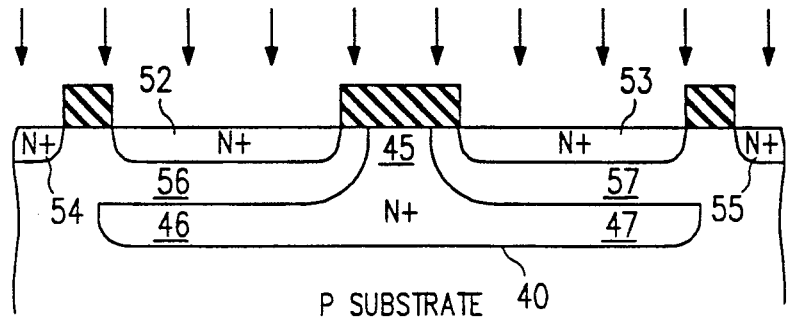

Referring to FIG. 3c, as the final step in this implant stage, a second N+ implant/diffusion using Arsenic forms both (a) N+ sourcelines 52 and 53 into the upper portion of the N-channel regions 43 and 44 over the drain sections 46 and 47 of the read bitlines, and (b) N+ program bitlines 54 and 55.

The depth of the sourcelines 52/53 over the drain sections 46/47 of the read bitlines 40 defines N-channel layers 56 and 57 characterized by a predetermined channel length in the vertical dimension. The spacing between the sourcelines 52/53, and the program bitlines 54/55, defines corresponding PT channel regions 58 and 59 characterized by a predetermined channel length in the planar dimension.

The arsenic (or phosphorous) implant is performed, to create the N+ VG and program bitlines (arsenic is preferred over phosphorous because of slower, more controlled diffusion). Implant is followed by a thermal diffusion/annealing procedure, to provide thermal drive to a desired depth, and surface annealing. This final thermal drive procedure produces the final junction depths for each of the implant regions. The sourceline extends down to a depth that corresponds to the desired source/channel junction for the vertical transistor, thereby defining the channel length for that transistor.

Figure 3D:
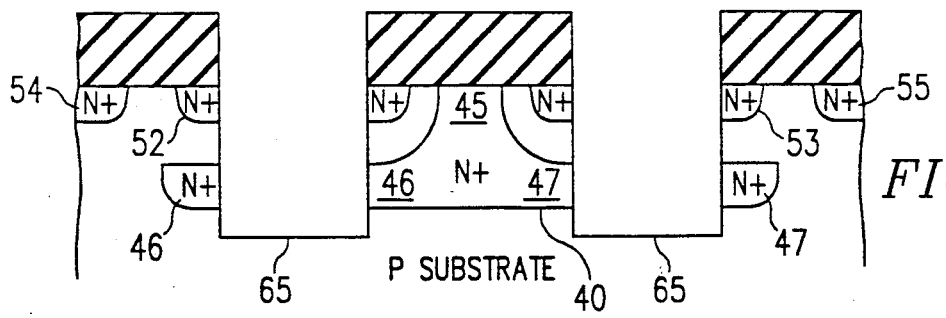
Figure 3E:
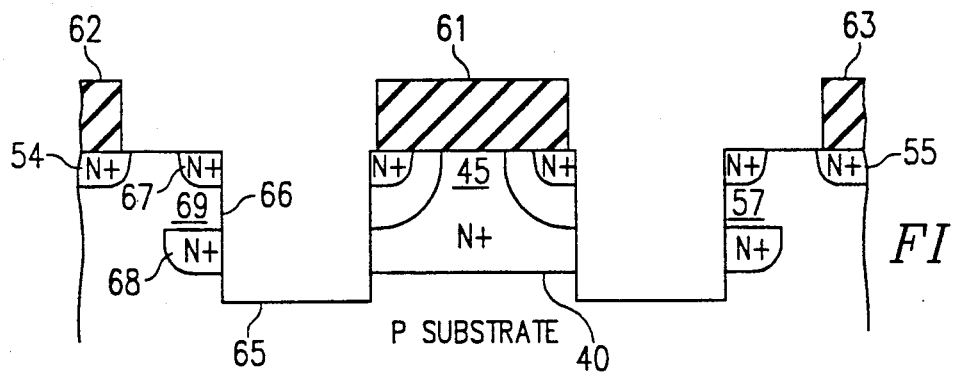

2.2. Trench Formation. Referring to FIGS. 3d and 3e, the second stage of fabrication involves formation, in each row, of the trenches into which will be formed the vertical floating gate transistors for each memory cell.

Referring to FIG. 3d, a substrate surface is patterned to expose trench areas 65. A trench etch procedure is used to form trenches 65 of a selected configuration, size and spacing. For the exemplary embodiment, the trench cross sectional configuration is substantially square, and has substantially straight sidewalls. The trench sidewalls need not be vertical, but vertical sidewall construction is more surface-area efficient and provides the shortest channel length transistor.

Generally, the configuration and size of the trench, and therefore of the memory cell, is not critical to the invention, subject to the trench area and depth constraints imposed by the configuration of the source and drain bitlines, as described in this Section. In particular, selecting the size of the trench determines the channel width—although increasing the cross sectional area of the trench to increase channel width also increases overall cell size.

The trench etch defines trenches 65 with vertical sidewalls 66. The etch is controlled such that the trench extends down through the sourcelines (52 and 53 in FIG. 3d), through the N-channel layers 56 and 57, and through the drain sections of the read bitline (46 and 47 in FIG. 3d).

As a result, in the vicinity of each trench 65, source regions 67 and VT drain regions 68 (24 and 23 in FIG. 1a) are defined for the vertical transistor. These source and VT drain regions surround the trench, and are separated by a channel region 69 (25 in FIG. 1a) having the selected VT channel length.

Trench cross sectional area and the widths of the sourceline and drain sections of the read bitlines must be cooperatively chosen to ensure that, after trench formation, both the source and drain bitlines provide a continuous conductive path along a respective row. Thus, the trench cross sectional area must be such that the sourcelines 52 and 53 and the VT drain regions 46 and 47 of the read bitline completely surround each trench, which is accomplished in the exemplary embodiment by making the trench width less than the widths of the source bitlines and the VT drain regions of the read bitlines (see, FIGS. 1 and 1a).

This configuration provides continuous source regions 67 and drain regions 68 around each trench. As a result, the channel region 66 is also continuous around each trench, thereby maximizing the channel interface to the floating gate, and optimizing charging efficiency.

2.3. Gate Conductor Formation. The third stage of fabrication involves formation of the vertical floating gate and program gate conductors, and associated insulating layers.

Referring to FIG. 3e, a layer of thick oxide is formed over the substrate (and into the trenches) to a thickness of, for example, 5000–10,000 Angstroms. The thick oxide may be thermally grown in a localized oxidation process by exposure to steam (for example, at about 900C and one atmosphere for several hours). Alternatively, the thick oxide may be formed by chemical vapor deposition (CVD).

The substrate is then patterned to define the floating gates FG and etched to remove the thick oxide except for the segment 61 above the surface section 45 of the read bitline 40, and the segments 62 and 63 above the program bitlines 54 and 55. The thick oxide segment 61 over the center portion of each read bitline will separate vertical transistors of adjacent cell pairs, while the thick oxide segments 62 and 63 over the program bitlines will separate the planar transistors of adjacent cell pairs.

Figure 3F:
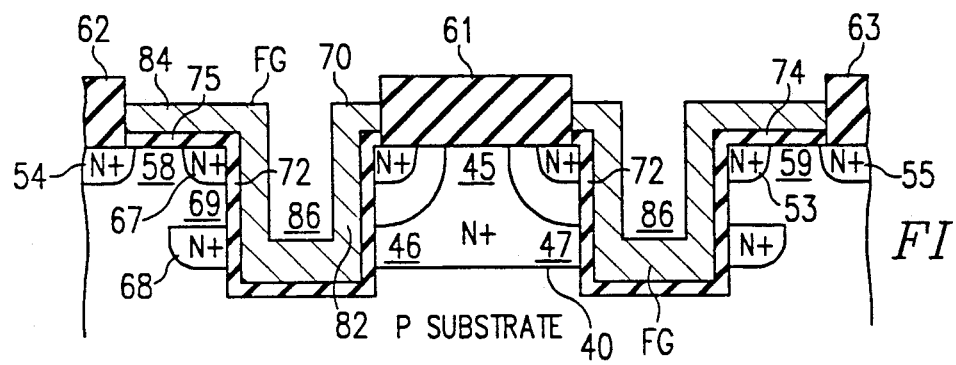
Figure 3G:
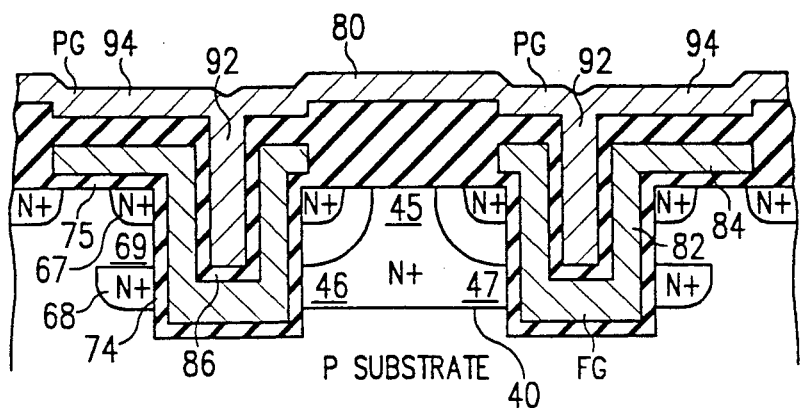

Referring to FIG. 3f, an insulating oxide layer 70 is then thermally grown over the substrate surface and into the trenches 65, forming a gate oxide layer 72 on trench sidewalls 66 over VT channel regions 69, and gate oxide layers 74 and 75 respectively over the PT channel regions 58 and 59. The gate oxide layer is grown to a thickness of about 100–200 Angstroms. Alternatively, the gate oxide may be formed by CVD, but a grown oxide is generally preferred from an oxide quality standpoint. Next, a first polysilicon layer, which will form the floating gates FG for the memory cells, is then deposited over the substrate to a thickness of about 1000–3000 Angstroms, and highly doped N+ with phosphorous to render it conductive. The poly 1 layer is then patterned and etched to form the floating gates between thick oxides 61, 62 and 63

For each memory cell, the poly 1 conductive layer extends from the thick oxide 61 on the vertical-transistor end of the cell, to the thick oxide 62/63 on the planar-transistor end of the cell, defining a floating gate that extends across the cell and into the associated trench. That is, the floating gate FG extends continuously across the vertical and planar transistors of the cell.

For each memory cell, the poly 1 floating gate FG includes a vertical transistor floating gate segment 82 and a planar transistor segment 84. The VT floating gate segment 82 extends vertically along the sidewalls 66 of a trench 65, over the VT channel region 69. The PT floating gate segment 84 extends across the planar transistor, over the PT channel region 58. The VT segment 82 of the poly 1 layer covers the surfaces of the trench, leaving a central hole 86 in the trench.

Referring to FIG. 3f, an interlevel oxide layer ILO is formed over each floating gate conductor. This interlevel oxide layer is thermally grown in a local oxidation process to a thickness of about 100–200 Angstroms. Alternatively, an oxide/nitride/oxide layer of equivalent oxide (electrical) thickness may be used.

Next, a second polysilicon layer is deposited over the substrate extending, for each cell, across the cell and into the trench hole 86. This poly 2 layer is deposited to a thickness of about 1000–3000 Angstroms, and highly doped N+ with phosphorous to render it conductive.

This poly 2 layer is then patterned to form the wordlines that incorporate the program gates for each transistor. For each memory cell, the poly 2 wordline extends continuously across the vertical and planar transistors of the cell, and covers the thick oxide 61 on the vertical transistor end of the cell, and the thick oxide 62/63 on the planar transistor end of the cell. Thus, the program gates will overlap the full length of the floating gate, extending across the cell and into the associated trench, and providing maximum capacitive coupling.

For each memory cell, the poly 2 program gate PG includes a vertical transistor segment 92 and a planar transistor segment 94. The VT program gate segment 92 extends vertically along the vertical floating gate segment 82, over the VT channel region 69. The PT program gate segment 94 extends across the planar transistor, over the PT floating gate.

4. Conclusion. Although the invention has been described with respect to exemplary embodiments, various changes and modifications of the disclosed embodiments, as well as alternative embodiments, will be suggested to one skilled in the art. It is, therefore, intended that the invention encompass such changes and modifications as fall within the scope of the appended claims.

What is claimed is:

1. A two-transistor programmable memory cell, with one vertical floating gate transistor, formed in a substrate of a first conductivity type, comprising:
    a vertical transistor including a source region and a sub-source VT drain region vertically disposed in the substrate adjacent a trench, defining a VT channel region of a selected VT channel length in the vertical dimension and a channel width around the trench;
    a planar transistor including said source region and a co-planar PT drain region, defining a PT channel region with a selected PT channel length in the planar dimension;
    a VT floating gate conductor insulatively disposed in said trench, over said VT channel region;
    a PT floating gate conductor insulatively disposed over said PT channel region;
    a VT program gate conductor insulatively disposed over said VT floating gate; and
    a PT program gate conductor insulatively disposed over said PT floating gate.

2. The two-transistor programmable memory cell of claim 1, wherein:
    the VT channel length is selected such that the vertical transistor is characterized by a relatively higher current capacity; and
    the PT channel length is selected such that the planar transistor is characterized by a relatively lower current capacity.

3. The two-transistor programmable memory cell of claim 1, wherein said VT floating gate and said PT floating gate comprise segments of a single floating gate.

4. The two-transistor programmable memory cell of claim 3, wherein said VT program gate and said PT floating gate comprise segments of a single program gate.

5. The two-transistor programmable memory cell of claim 1, wherein for each trench said VT floating gate is disposed around the walls of the trench defining a central hole, and said VT program gate is disposed into the hole, thereby maximizing the program gate voltage required to charge the floating gate.

6. The two-transistor programmable memory cell of claim 5, wherein said trench is substantially square.

7. The two-transistor programmable memory cell of claim 1, wherein said trench is surrounded by said source and VT drain regions.

8. The two-transistor programmable memory cell of claim 1, wherein the substrate is P-type and said source and VT and PT drain regions are doped N-type.

9. A two-transistor programmable memory cell, with one vertical floating gate transistor, formed in a substrate of a first conductivity type, comprising:
    a source region of a second conductivity type formed in said substrate;
    a sub-source VT channel region of the first conductivity type, formed under said source region, with a selected VT channel length in the vertical dimension;
    a sub-channel VT drain region of the second conductivity type formed under said VT channel region;
    a co-planar PT channel region of the first conductivity type formed in the substrate adjacent said source region with a selected PT channel length in the planar dimension;
    a co-planar PT drain channel region of the second conductivity type formed in the substrate adjacent said PT channel region;
    a trench area of a selected configuration formed in the substrate extending through said source and VT channel regions and at least partially into said VT drain region;
    such that said source region and said VT drain region together with said VT channel region define a vertical transistor with a selected channel length, and said source region and said PT drain region together with said PT channel region form a planar transistor with a selected channel length;
    a floating gate conductor having a VT segment insulatively disposed vertically into the trench and a PT segment extending over the PT channel region and at least a portion of the PT drain region, such that the VT segment of said floating gate is capacitively coupled to said VT channel region and the PT segment of said floating gate is capacitively coupled to said PT channel region; and
    a program gate insulatively disposed said floating gate; such that said floating gate and said program gate are common to said vertical and planar transistors.

10. The two-transistor programmable memory cell of claim 9, wherein:
    the channel length of said VT channel is selected such that the vertical transistor is characterized by a relatively higher current capacity; and
    the channel length of said PT channel is selected such that the planar transistor is characterized by a relatively lower current capacity.

11. The two-transistor programmable memory cell, comprising:
    a vertical transistor including a source region and a sub-source VT drain region vertically disposed in a substrate adjacent a sidewall and above a bottom surface of a trench, defining a VT channel region of a selected VT channel length in the vertical dimension and a channel width around the trench; and a planar transistor including said source region and a coplanar PT drain region, defining a PT channel region with a selected PT channel length in the planar dimension.

12. The device of claim 11, including a VT floating gate conductor insulatively disposed in said trench, over said VT channel region.

13. The device of claim 11, including a PT floating gate conductor insulatively disposed over said PT channel region.

14. The device of claim 12, including a VT program gate conductor insulatively disposed over said VT floating gate.

15. The device of claim 13, including a PT program conductor insulatively disposed over said PT floating gate.